(12) United States Patent
Takano et al.

(10) Patent No.: US 10,651,119 B2
(45) Date of Patent: May 12, 2020

(54) SEMICONDUCTOR MODULE AND METHOD OF MANUFACTURING SEMICONDUCTOR MODULE

(71) Applicant: TAIYO YUDEN CO., LTD., Tokyo (JP)

(72) Inventors: Takayuki Takano, Tokyo (JP); Tasuku Kawashima, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/228,458

(22) Filed: Dec. 20, 2018

(65) Prior Publication Data
US 2019/0198430 A1   Jun. 27, 2019

(30) Foreign Application Priority Data
Dec. 26, 2017   (JP) .................. 2017-249586

(51) Int. Cl.
*H01L 23/498* (2006.01)
*H01L 23/14* (2006.01)
*H01L 21/48* (2006.01)
*H01L 23/538* (2006.01)

(52) U.S. Cl.
CPC ........ *H01L 23/4985* (2013.01); *H01L 21/486* (2013.01); *H01L 21/4853* (2013.01); *H01L 23/145* (2013.01); *H01L 23/49827* (2013.01); *H01L 23/5384* (2013.01); *H01L 23/5387* (2013.01); *H01L 23/49844* (2013.01)

(58) Field of Classification Search
CPC ............... H01L 23/4985; H01L 23/145; H01L 23/49827; H01L 23/5384; H01L 23/5387; H01L 23/49844; H01L 21/4853; H01L 21/486
USPC .......................................... 257/668
See application file for complete search history.

(56) References Cited

U.S. PATENT DOCUMENTS

2015/0200337 A1 * 7/2015 Denda ............. H05K 1/115
257/99

FOREIGN PATENT DOCUMENTS

JP    2014-45211 A    3/2014

* cited by examiner

*Primary Examiner* — Tong-Ho Kim
(74) *Attorney, Agent, or Firm* — Chen Yoshimura LLP

(57) ABSTRACT

The present disclosure includes: a flexible resin substrate made of a polyimide resin; an adhesion layer provided on the resin substrate; a semiconductor element mounted face down to the resin substrate and fixed to the resin substrate through the adhesion layer; a via hole provided in the resin substrate to correspond to an element electrode of the semiconductor element; a module electrode provided to the resin substrate to be in contact with the element electrode of the semiconductor element through the via hole; a protruding portion provided, around the element electrode or in a peripheral edge portion of the semiconductor element, on a surface of the semiconductor element; and an escape portion for the adhesion layer covering a head portion of the protruding portion to escape, the escape portion being provided in a region, of the resin substrate, corresponding to the protruding portion.

10 Claims, 16 Drawing Sheets

SEMICONDUCTOR MODULE AND METHOD OF MANUFACTURING SEMICONDUCTOR MODULE

CROSS-REFERENCE TO RELATED APPLICATIONS

The present application claims a priority from Japanese Patent Application No. 2017-249586 filed on Dec. 26, 2017, the content of which herein incorporated by reference.

BACKGROUND

Technical Field

The present disclosure relates to a semiconductor module and a method of manufacturing a semiconductor module.

Related Art

In a semiconductor device, a depletion layer can be widened near a terminal end portion of an electrode in a pn junction of a semiconductor layer in a SiC substrate. The depletion layer suppresses concentration of electric field in the terminal end portion of the electrode. This pn junction is commonly referred to as guard ring. However, on a portion of a front surface of a semiconductor chip corresponding to the guide ring, a field oxide film is provided or a thick electrode is formed on the field oxide film. Accordingly, a ring-shaped protruding portion is formed on the front surface of the semiconductor element of a completed bare chip. When the semiconductor element is to be mounted on and bonded to a resin substrate covered with an adhesion layer, a via hole is provided in the resin substrate so that the electrode is exposed on a surface of the resin substrate. In this case, there is a risk that the protruding portion of the semiconductor device pushes out the adhesion layer so that the adhesion layer may flow out to the inside of the via hole thereby filling the via hole or reducing the size of the via hole.

SUMMARY

A semiconductor module according to one aspect of the present disclosure includes a flexible resin substrate made of a polyimide resin; an adhesion layer provided on the resin substrate; a semiconductor element mounted face down to the resin substrate and fixed to the resin substrate through the adhesion layer; a via hole provided in the resin substrate to correspond to an element electrode of the semiconductor element; a module electrode provided to the resin substrate to be in contact with the element electrode of the semiconductor element through the via hole;
a protruding portion provided, around the element electrode or in a peripheral edge portion of the semiconductor element, on a surface of the semiconductor element; and an escape portion for the adhesion layer covering a head portion of the protruding portion to escape, the escape portion being provided in a region, of the resin substrate, corresponding to the protruding portion.

DETAILED DESCRIPTION

Figure 1:
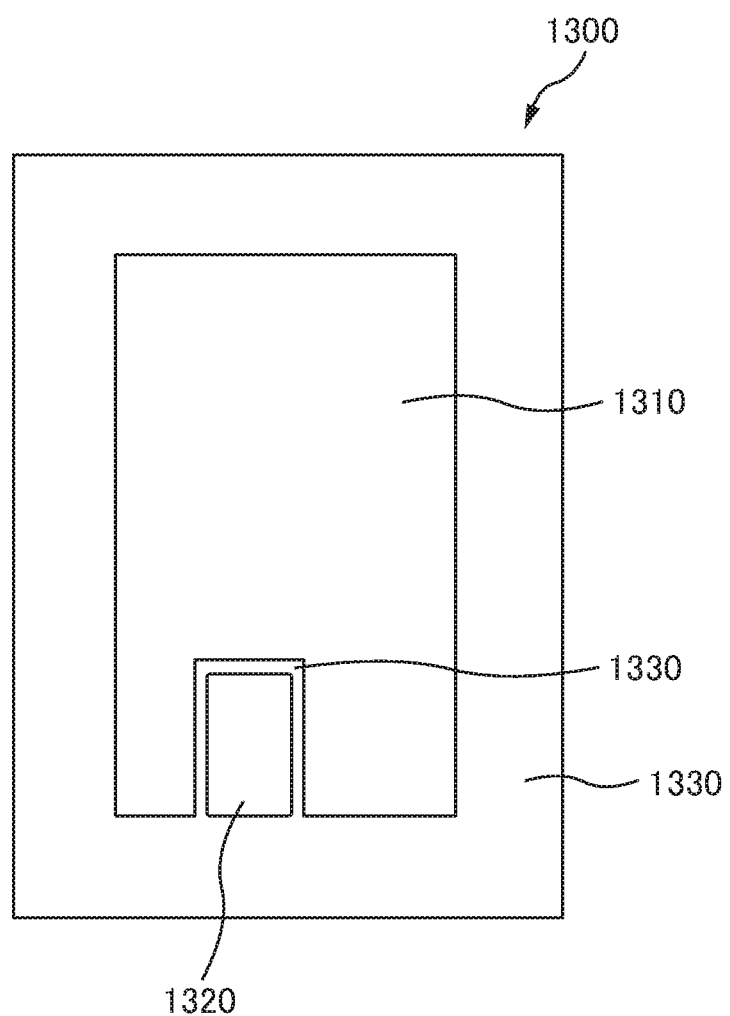
FIG. 1 is a schematic view of a field effect transistor.

A semiconductor module according to an embodiment of the present disclosure will be described below with reference to drawings as necessary. Note that the same or similar elements in the drawings are given the same or similar reference numerals.

Figure 2:
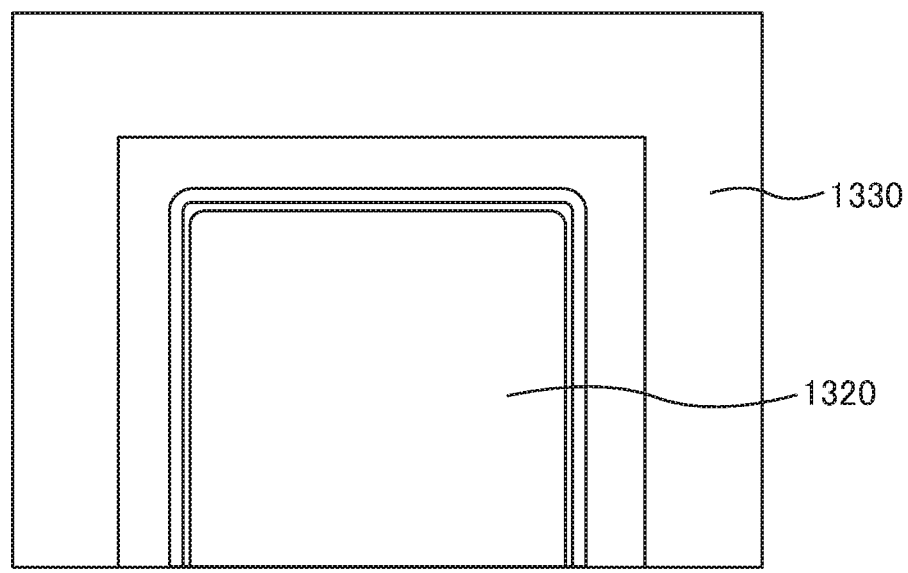
FIG. 2 is an enlarged view of a field effect transistor.
Figure 3A:
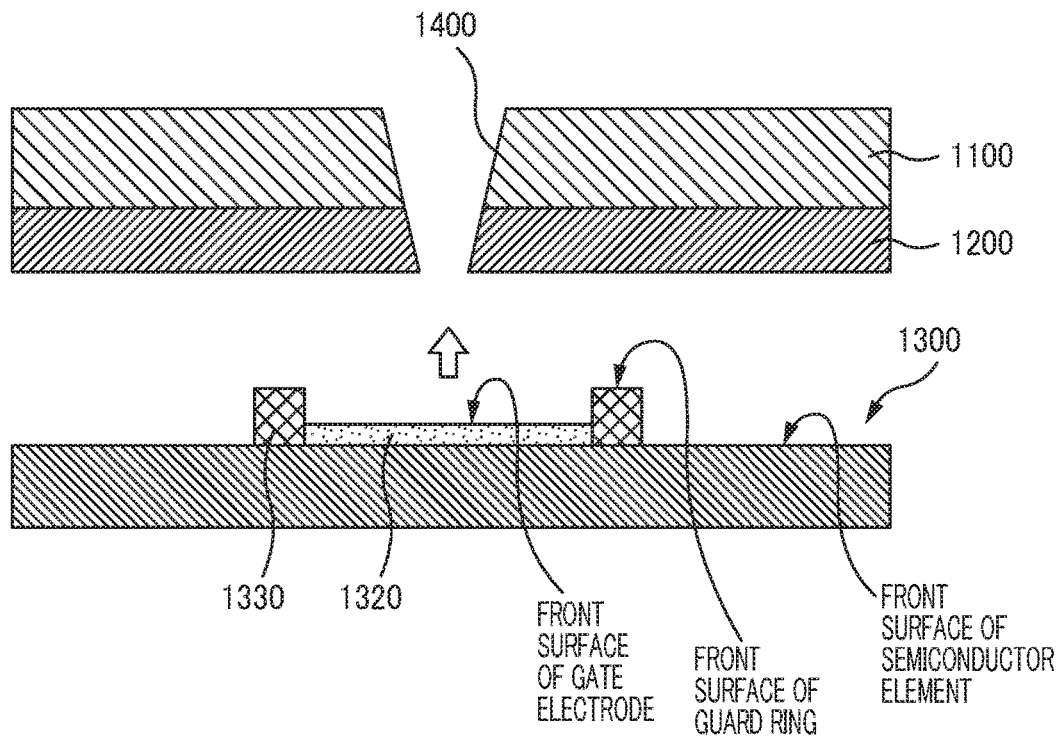
FIG. 3A is a cross-sectional view schematically illustrating a common semiconductor module.
Figure 3B:
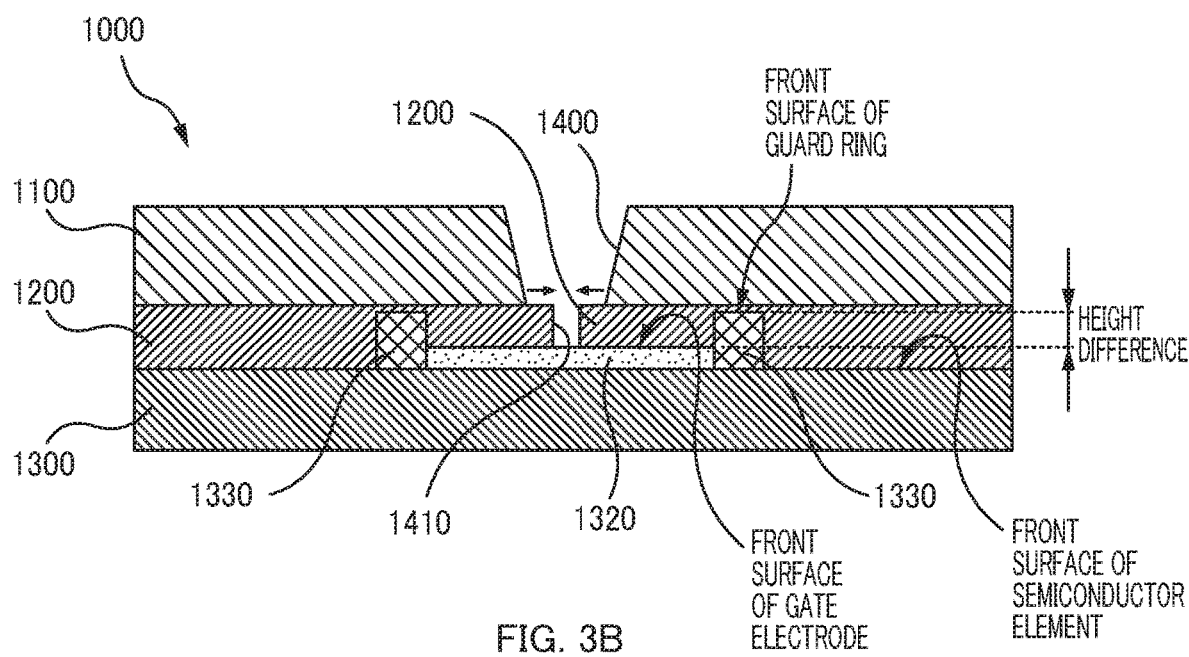
FIG. 3B is a cross-sectional view schematically illustrating a common semiconductor module.
Figure 4:
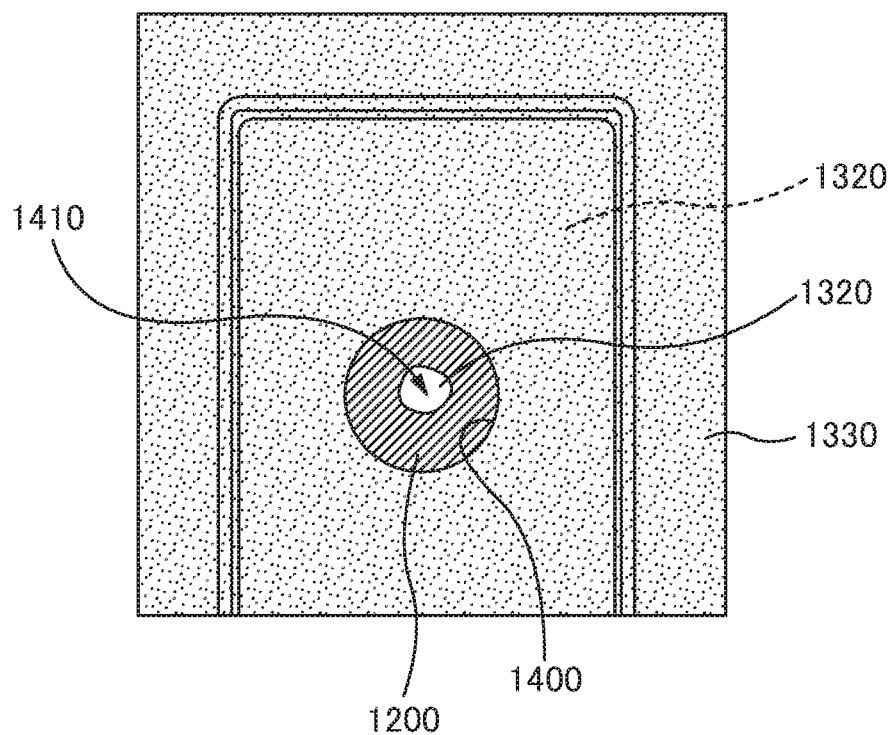
FIG. 4 is a plan view schematically illustrating a via hole in a first design of a common semiconductor module.
Figure 5:
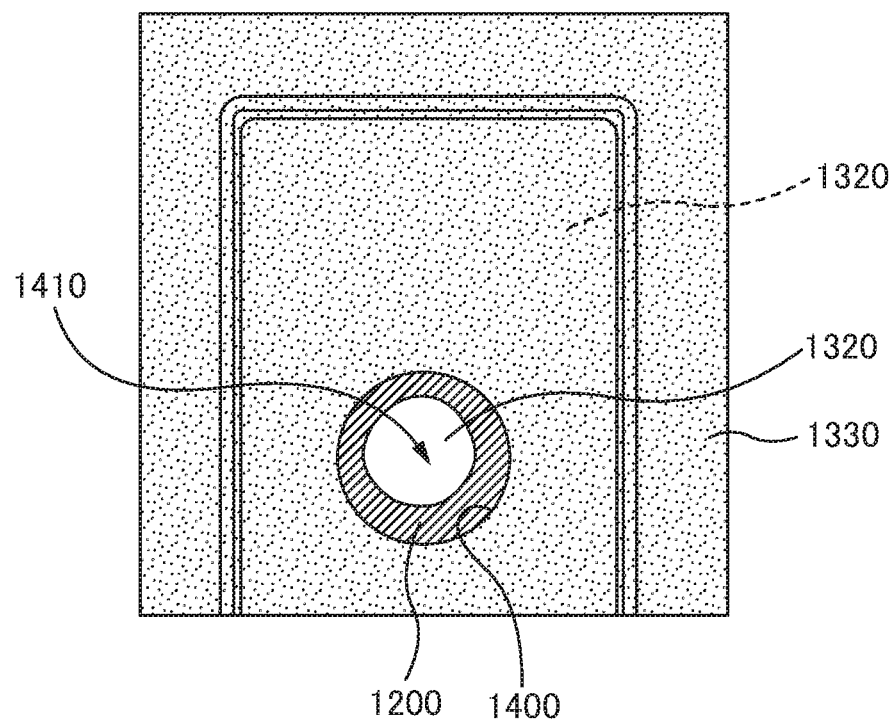
FIG. 5 is a plan view schematically illustrating a via hole in a second design of a common semiconductor module.
Figure 6:
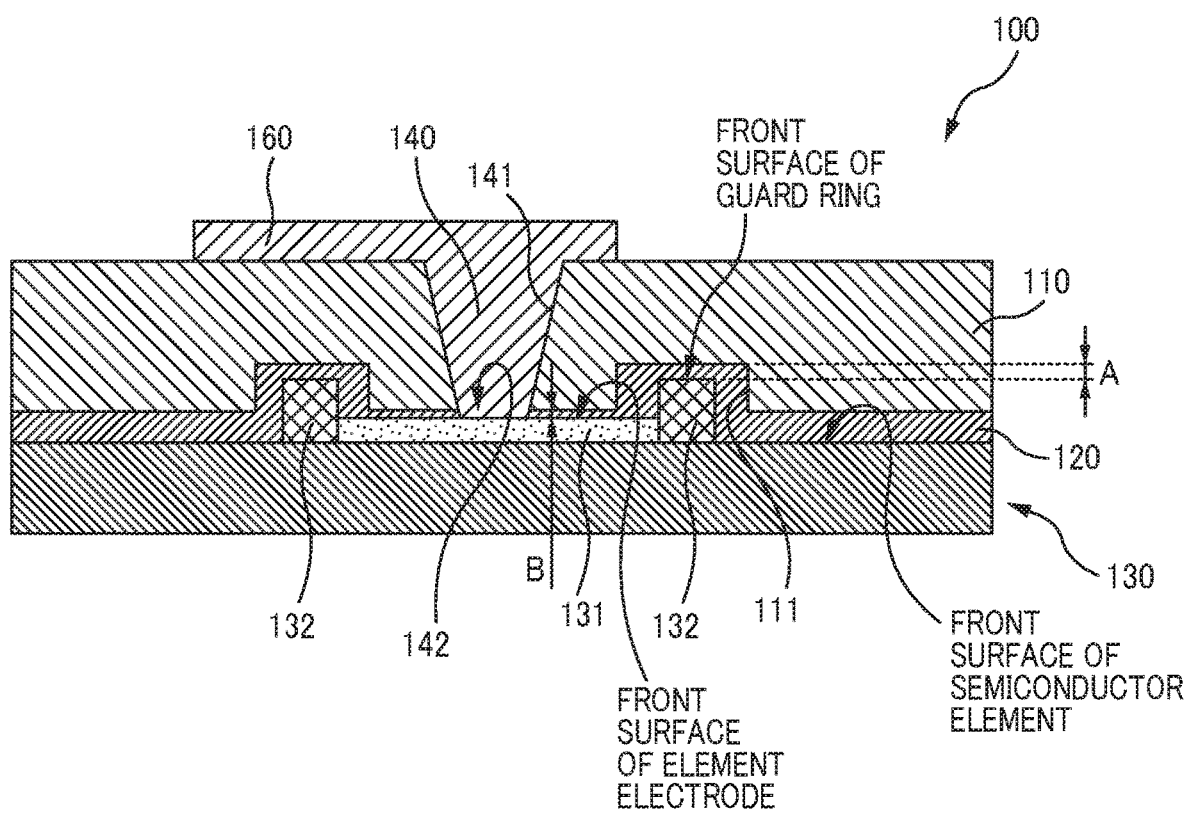
FIG. 6 is a cross-sectional view schematically illustrating a semiconductor module according to an embodiment of the present disclosure.
Figure 7:
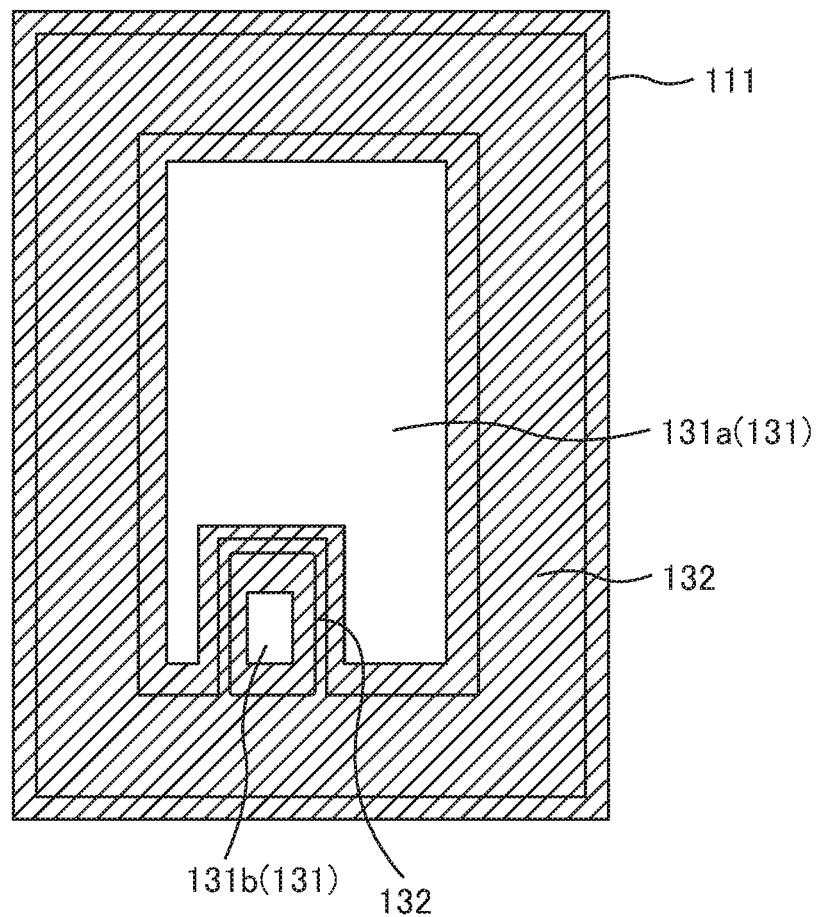
FIG. 7 is a plan view schematically illustrating a semiconductor module according to an embodiment of the present disclosure.
Figure 8:
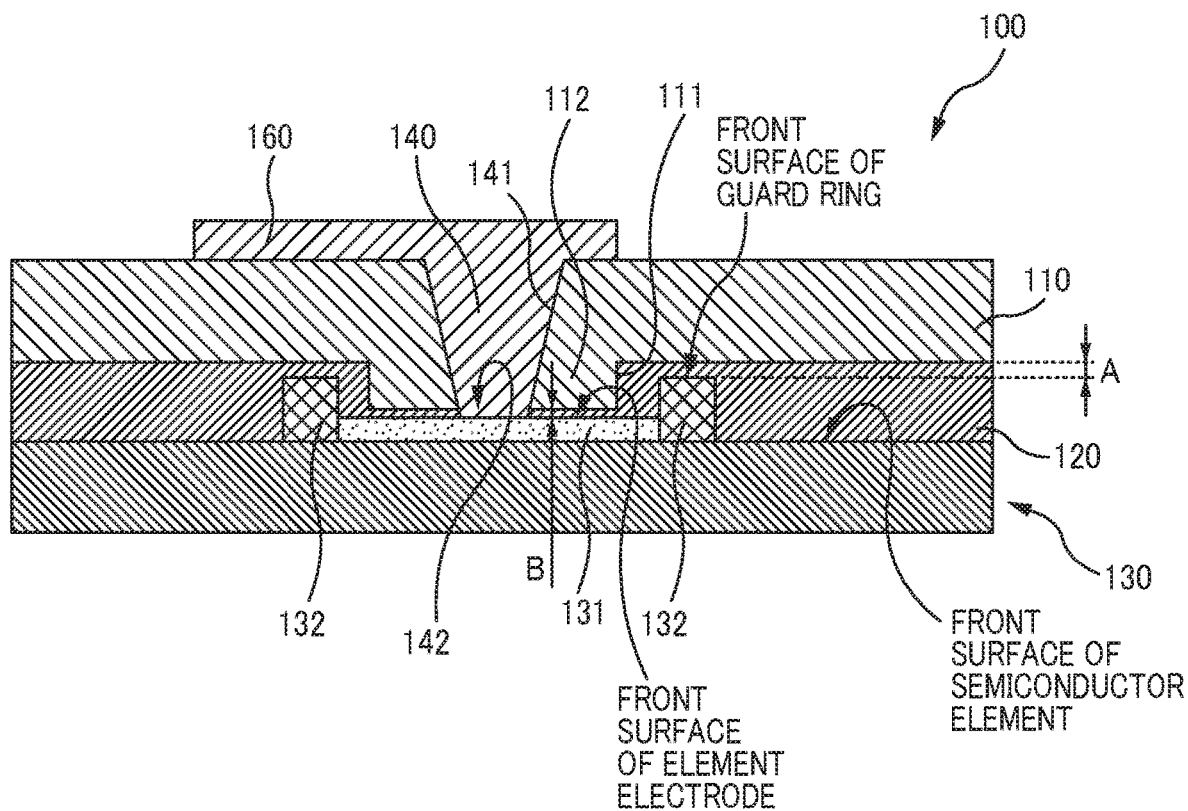
FIG. 8 is a cross-sectional view schematically illustrating a semiconductor module according to another embodiment of the present disclosure.

A common semiconductor module will be described with reference to FIGS. 1 to 5. Then, a semiconductor module according to an embodiment of the present disclosure will be described with reference to FIGS. 6 to 9. FIG. 1 is a schematic view of a field effect transistor. FIG. 2 is an enlarged view of the field effect transistor. FIGS. 3A and 3B are cross-sectional views schematically illustrating the common semiconductor module. FIG. 4 is a plan view schematically illustrating a via hole in a first design of the common semiconductor module. FIG. 5 is a plan view schematically illustrating a via hole in a second design of the common semiconductor module. FIG. 6 is a cross-sectional view schematically illustrating the semiconductor module according to an embodiment of the present disclosure. FIG. 7 is a plan view schematically illustrating the semiconductor module according to an embodiment of the present disclosure. FIG. 8 is a cross-sectional view schematically illustrating a semiconductor module according to another embodiment. FIGS. 9A to 9H are cross-sectional views illustrating an outline of manufacturing steps of the semiconductor module according to an embodiment of the present disclosure.

In a power semiconductor device, thin metal wires are coupled by means of wire bonding between a source electrode of a semiconductor element and a lead frame, and between a gate electrode of the semiconductor element and the lead frame. In this case, electrode pads of a power semiconductor element need to have such a size that the electrode pads do not interfere with wire bonding. Particularly, in order to improve a withstand voltage and electric characteristics of a power semiconductor device, the area of the source electrode is made as large as possible, resulting in the area of the gate electrode being small. Accordingly, when the thin metal wires are employed, an inductance component and a resistance component are generated due to the thin wires, which may cause reduction in speed and generation of heat. In order to solve such issues, there is one implemented by providing the power semiconductor element on a heat-resistant polyimide substrate, providing a via hole in a portion corresponding to the electrode of the power semiconductor element, and forming wiring by filling the via hole by plating. Particularly, in this case, the dimension of the via hole corresponding to the gate electrode is about Φ50 μm.

Meanwhile, a field effect transistor in the power semiconductor device as described above includes a ring-shaped protruding portion, as described in the common example. As illustrated in FIG. 1, a power semiconductor element 1300 includes a source electrode 1310 in a center portion of a front surface, a gate electrode 1320 is provided at an edge of the front surface, and a drain electrode (not illustrated) which is a solid electrode is provided to a back surface. The power semiconductor element 1300 is a so-called vertical transistor.

Moreover, the power semiconductor element 1300 (field effect transistor) includes a guard ring 1330 (see FIG. 2) provided to extend along the outline of the gate electrode 1320 and a guard ring 1330 (see FIG. 1) provided to extend along the outline of the source electrode 1310. In general, for example, a field oxide film and an electrode provided on a field oxide film are provided on a guard ring that is composed of a diffused region formed in a semiconductor layer. Since these field oxide film and electrode have thicknesses, the guard ring is provided as if one formed by surrounding a certain area with a protrusion-shaped portion is provided.

When the front surface of the power semiconductor element 1300 is observed, portions protruding upward (upward in drawings of FIGS. 3A and 3B) from the front surface, namely the protruding portions 1330 are provided to surround the gate electrode 1320 and the source electrode 1310. Hereafter, in this example, such protruding portions 1330 each are referred to as the guard ring 1330 or the protruding portion 1330.

In a semiconductor module 1000 using a power overlay technology, the power semiconductor element 1300 is bonded to one surface of a resin substrate 1100 via an adhesion layer 1200, as illustrated in FIG. 3A. The power semiconductor element 1300 is configured with a vertical transistor or a lateral transistor of a BIP type or a MOS type, and is a high-current transistor made of SiC, GaN, Si, GaAs, or the like in terms of a material.

At least the source electrode 1310 and the gate electrode 1320 are arranged in the aforementioned power semiconductor element 1300 and the aforementioned protrusion-shaped guard rings 1330 are provided to the front surface of the power semiconductor element 1300. As illustrated in FIGS. 3A and 3B, the power semiconductor element 1300 provided with the guard rings 1330 is bonded to the resin substrate 1100 via the adhesion layer 1200.

In this case, as illustrated in FIG. 3B, the adhesion layer 1200 is pushed toward a via hole 1400 due to the guard ring 1330 of the power semiconductor element 1300. This causes an issue that the area of an opening 1410 of the via hole 1400 is substantially reduced.

As a result of studying such an issue, it has been confirmed experimentally that the amount of the adhesion layer 1200 pushed toward the via hole 1400 varies with the difference in height (see FIG. 3B) between the front surface of the guard ring 1330 and the front surface of the gate electrode 1320. In a more specific description, for example, when the vertical distance from the front surface of the gate electrode 1320 to the front surface of the guard ring 1330 is about 7 μm, the area of the front surface of the gate electrode 1320 exposed through the via hole 1400 having a size of 200 μm is about one tenth of the area of the opening 1410 of the via hole 1400, as illustrated in FIG. 4. Meanwhile, for example, when the vertical distance from the front surface of the gate electrode 1320 to the front surface of the guard ring 1330 is about 3 μm, the area of the front surface of the gate electrode 1320 exposed through the via hole 1400 having a size of 200 μm is about one third of the area of the opening 1410 of the via hole 1400, as illustrated in FIG. 5. As described above, such new knowledge is obtained that the smaller the difference in height between the front surface of the guard ring 1330 and the front surface of the gate electrode 1320 is, the smaller the amount of the adhesion layer 1200 pushed out toward the via hole 1400 is.

A semiconductor module 100 according to an embodiment of the present disclosure provides a structure and manufacturing method for reducing the amount of an adhesion layer 120 flowing out to a via hole 141 based on such new knowledge.

As illustrated in FIG. 6, the semiconductor module 100 according to an embodiment of the present disclosure includes a resin substrate 110 having one surface provided with the adhesion layer 120, a semiconductor element 130 adhering to the resin substrate 110 through the adhesion layer 120, and a module electrode 160 formed on the other surface of the resin substrate 110. Note that the adhesion layer 120 is formed of, for example, one obtained by applying paste (adhesive) to the resin substrate 110, a sheet made of adhesive, or the like. Moreover, in place of a structure in which the adhesion layer 120 is provided to the resin substrate 110, the adhesion layer 120 may be thinly formed by spinning.

The resin substrate 110 is a substrate having a thin layer body or a film shape which is stable and non-fluid. The resin substrate 110 may be any substrate as long as it can have, for example, a form of lamination or film and is made of any one of materials such as polymer films and polyimide resins including Kapton (registered trademark), Ultem (registered trademark), polytetrafluoroethylene (PTFE), Upilex (registered trademark), polysulfone materials (for example, Udel (registered trademark) and Radel (registered trademark)), liquid crystal polymers (LCP), and the like.

In an embodiment of the present disclosure, description will be given below using the polyimide resin as the resin substrate 110. Here, the polyimide resin is a collective term for polymers including imide bonds in repeating units and generally refers to aromatic polyimides in which aromatic compounds are linked directly by imide bonds. In the aromatic polyimide, since an aromatic group and an aromatic group form a conjugated structure via the imide bond, the aromatic polyimide has a stiff and firm molecular structure. Moreover, since the imide bond of the polyimide resin has high intermolecular force, the polyimide resin has good frequency properties and has the highest heat, mechanical, and chemical properties among all polymers. Accordingly, the polyimide resin is preferable for a power semiconductor element which is driven at a high current or which generates a large amount of heat. The thickness of the resin substrate 110 is preferably 10 to 50 µm, for example.

The semiconductor element 130 is a semiconductor which is, for example, a compound semiconductor such as gallium nitride semiconductor, a silicon semiconductor, a SiC semiconductor, GaAs, or the like. Specifically, for example, the semiconductor element 130 is a power transistor and is a field effect transistor, a JFET, a bipolar transistor, or the like.

Note that, in the following description, the semiconductor element 130 will be described as the field effect transistor. Moreover, the semiconductor element 130 may be either a lateral FET in which the source electrode, the gate electrode, and the drain electrode are all arranged on one surface or a vertical FET in which the source electrode and the gate electrode are arranged on one surface and the drain electrode is arranged on the other surface. In the following description, the semiconductor element 130 is described as the vertical FET. The semiconductor element 130 is electrically coupled to a module electrode provided to a front surface of the resin substrate 110 through a via 140 that is formed by introducing (plating) a conductive material into the via hole 141 provided in the resin substrate 110.

Note that the via 140 and the module electrode 160 are an integral object made of the same material such as Cu. For example, plating is formed on the resin substrate 110 and then subjected to patterning to form the module electrode 160 that is integral with the via 140. Moreover, coating using sputtering can be employed as a manufacturing method.

In FIG. 6, the resin substrate 110 and the semiconductor element 130 are schematically illustrated as if their peripheries match each other. However, a configuration may actually be such that the resin substrate 110 is larger than the semiconductor element 130 in a plan view and a semiconductor chip is mounted in a center portion of the resin substrate 110 such that the resin substrate 110 is visible around the semiconductor chip.

As illustrated in FIG. 7, in the semiconductor element 130, guard rings 132 are respectively provided to extend along the outlines of a gate electrode 131b and a source electrode 131a (hereafter, referred to as element electrodes 131). In other words, such a guard ring 132 is provided around the element electrode 131 or in a peripheral edge portion of the semiconductor element 130. The guard ring 132 may be either, for example, a protrusion-shaped electrode or a portion formed such that a field oxide film protrudes, and is formed around the element electrode 131 such that the guard ring 132 is higher than the element electrode 131.

In the following description, the source electrode may be referred to as drain electrode and the drain electrode may be referred to as source electrode depending on the direction of a current. In other words, the source electrode 131a is a current inflow electrode or current outflow electrode and the drain electrode (not illustrated) on the back surface is a current outflow electrode or current inflow electrode. Moreover, the front surface of the semiconductor element 130 refers to the surface on which the element electrodes 131 are arranged and generally refers to a surface of an insulating layer (not illustrated) made of a semiconductor insulating material such as $SiO_2$, $Si_3N_4$, or the like.

In the semiconductor module 100, the guard ring 132 on the front surface of the semiconductor element 130 is formed to be thicker than the element electrode 131 and forms a protrusion-shaped portion. This protrusion-shaped portion pushes out the adhesion layer 120 and causes it to escape. In order to avoid this, a recessed portion 111 is formed in the resin substrate 110 such that an inner wall of the recessed portion 111 covers the protrusion-shaped portion in such a way that the adhesion layer 120 does not flow out to the via hole 141. The recessed portion 111 (hereafter, also referred to as the escape portion 111) can secure a space that ensures a volume corresponding a portion to be pushed-out of the adhesion layer 120 so as to prevent the adhesion layer 120 from escaping to the via hole 141.

Moreover, as illustrated in FIG. 8, the escape portion 111 may be a portion forming a step. In the case of FIG. 6, in the plan view, the inner walls of the recessed portion 111 are formed close to an outer side wall and an inner side wall of the guard ring 132. In the case of FIG. 8, the inner side wall of the ring-shaped guard ring 132 is arranged close to the inner wall of the recessed portion 111 in the plan view, as in the case of FIG. 6, and a protruding portion 112 protruding from the resin substrate 110 is formed further inside in a ring shape. Moreover, a surface of the resin substrate 110 which is close to a head portion of the guard ring 132 extends toward the periphery as it is, with the resin substrate having a fixed thickness. In other words, the escape portion 111 has a recess form in FIG. 6, while has a shape like a step in FIG. 8.

Specifically, the escape portion 111 has a step-like shape in which the resin substrate 110 is formed such that the surface of the resin substrate 110 facing the front surface of the element electrode 131 is formed closer to the front surface of the semiconductor element 130 than the surface of the resin substrate 110 facing the guard ring 132 is and such that a surface of the resin substrate 110 on the side opposite to the element electrode 131 across the guard ring 132 forms a flat surface flush with the surface of the resin substrate 110 facing the guard ring 132.

Moreover, as illustrated in FIG. 6, the semiconductor module 100 is preferably formed such that the minimum distance A (interval A) between the front surface of the guard ring 132 and the surface of the resin substrate 110 facing the front surface of the guard ring 132 is greater than the minimum distance B (interval B) between the front surface of the element electrode 131 and the surface of the resin substrate 110 facing the front surface of the element electrode 131. It has been found experimentally that such a semiconductor module 100 has a significant effect of suppressing inflow of the adhesion layer 120 toward the via hole 141.

Note that the semiconductor module 100 is preferably formed such that the difference between the distance from the front surface of the semiconductor element 130 to the front surface of the guard ring 132 and the distance from the front surface of the semiconductor element 130 to the front surface of the element electrode 131 is 5 µm or more. This value is the best design value derived based on the experimental results.

Accordingly, the semiconductor module 100 illustrated in FIGS. 6 and 8 has the following excellent effect as compared to the semiconductor module 1000 illustrated in FIG. 3B. The adhesion layer 120 to be pushed out by the guard ring 132 is pushed out in a direction opposite to the via hole 141 with respect to the guard ring 132, thereby being able to suppress the adhesion layer 120 from blocking the via hole 141.

Steps of manufacturing the aforementioned semiconductor module 100 will be specifically described with reference to FIGS. 9A to 9H.

Figure 9A:
FIG. 9A is a cross-sectional view schematically illustrating a step of manufacturing a semiconductor module according to an embodiment of the present disclosure.
Figure 9B:
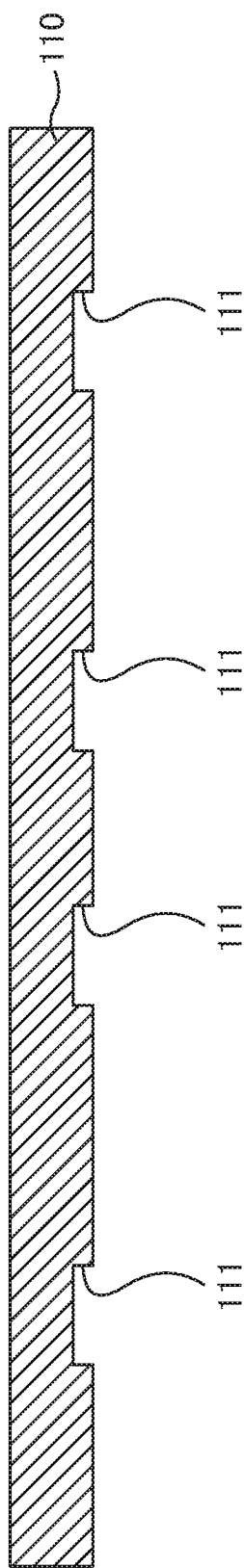
FIG. 9B is a cross-sectional view schematically illustrating a step of manufacturing a semiconductor module according to an embodiment of the present disclosure.

First, as illustrated in FIG. 9A, the resin substrate 110 is disposed. As illustrated in FIG. 9B, the escape portions 111 are formed in the resin substrate 110. Each escape portion 111 is formed to be located such that the guard ring 132 enters the escape portion 111 when the semiconductor element 130 is attached to the resin substrate 110 via the adhesion layer 120. Provision of the escape portion 111 can prevent the guard ring 132 of the semiconductor element 130 from causing the adhesion layer 120 to escape to the via hole 141. The escape portions 111 are processed by laser, but may be formed by pressing through machine processing.

Figure 9C:
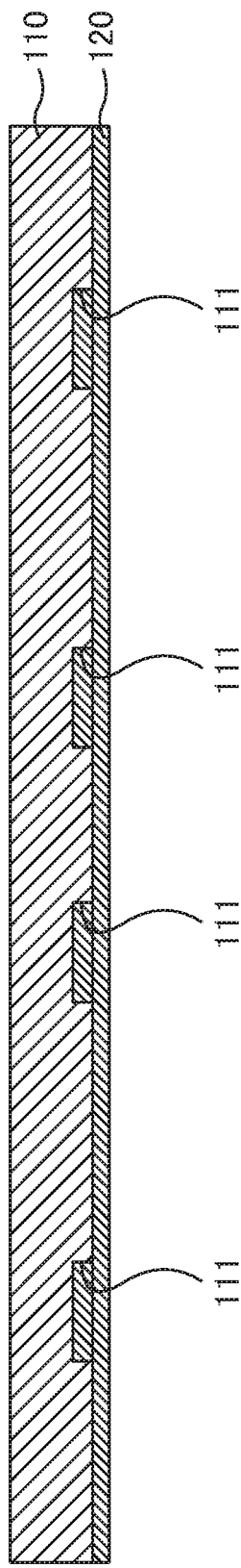
FIG. 9C is a cross-sectional view schematically illustrating a step of manufacturing a semiconductor module according to an embodiment of the present disclosure.
Figure 9D:
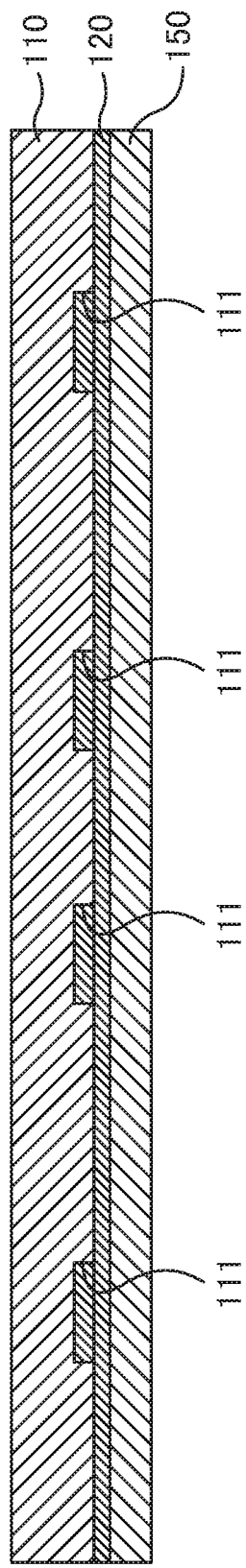
FIG. 9D is a cross-sectional view schematically illustrating a step of manufacturing a semiconductor module according to an embodiment of the present disclosure.
Figure 9E:
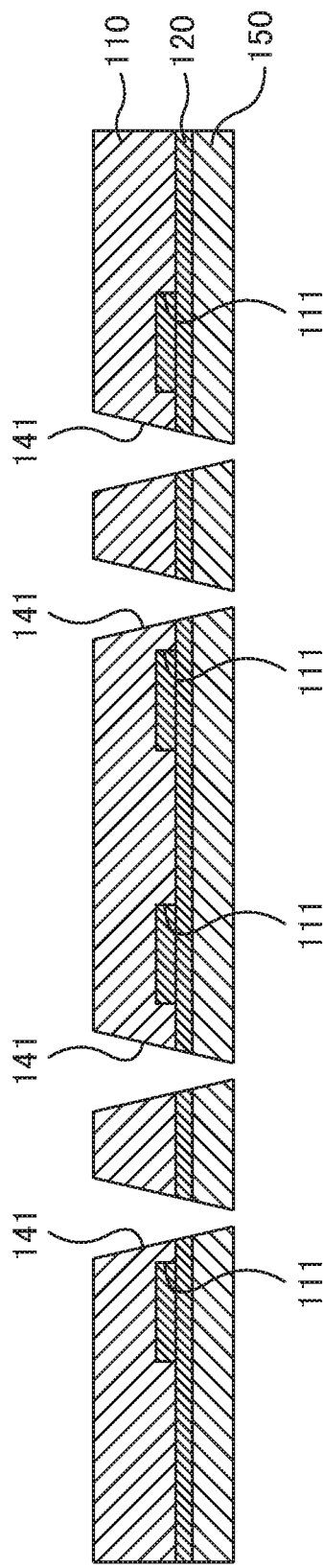
FIG. 9E is a cross-sectional view schematically illustrating a step of manufacturing a semiconductor module according to an embodiment of the present disclosure.
Figure 9F:
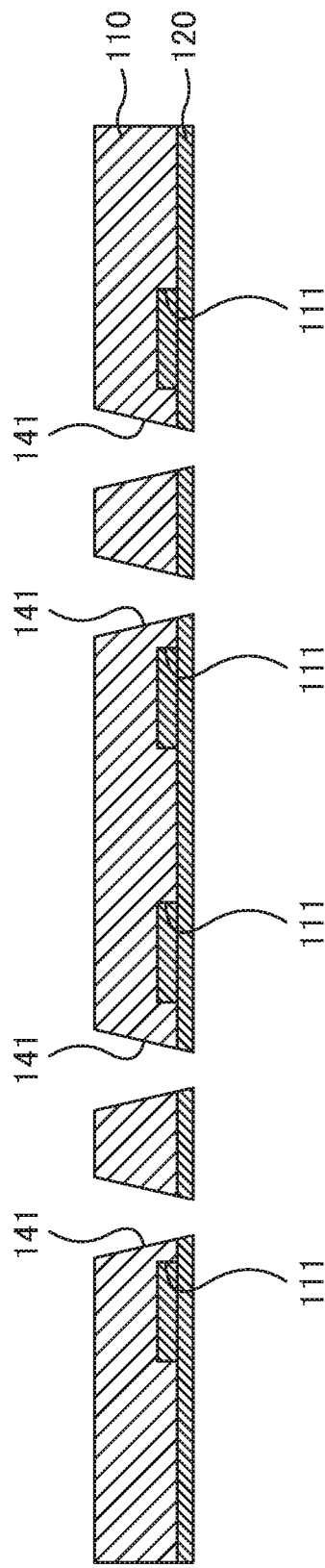
FIG. 9F is a cross-sectional view schematically illustrating a step of manufacturing a semiconductor module according to an embodiment of the present disclosure.

Next, as illustrated in FIG. 9C, the adhesion layer 120 is formed by applying adhesive onto one surface of the resin substrate 110 having the escape portions 111 formed therein. Note that the adhesion layer 120 is applied onto the resin substrate 110 by using, for example, a spin coating technique. Then, a protection sheet 150 is attached to the side, of the adhesion layer 120, opposite to the resin substrate 110 (FIG. 9D) and the via holes 141 are formed in the resin substrate 110 in this state (FIG. 9E). In this case, since laser processing is performed, the protection sheet is also processed. However, the processing only needs to be performed up to the adhesion layer. Thereafter, the protection sheet 150 is removed (FIG. 9F). Although description is given of the example in which the adhesion layer 120 is formed after the escape portions 111 are formed in the resin substrate 110 in FIGS. 9B and 9C, the escape portions 111 may be formed after the adhesion layer 120 is formed on the resin substrate 110.

Figure 9G:
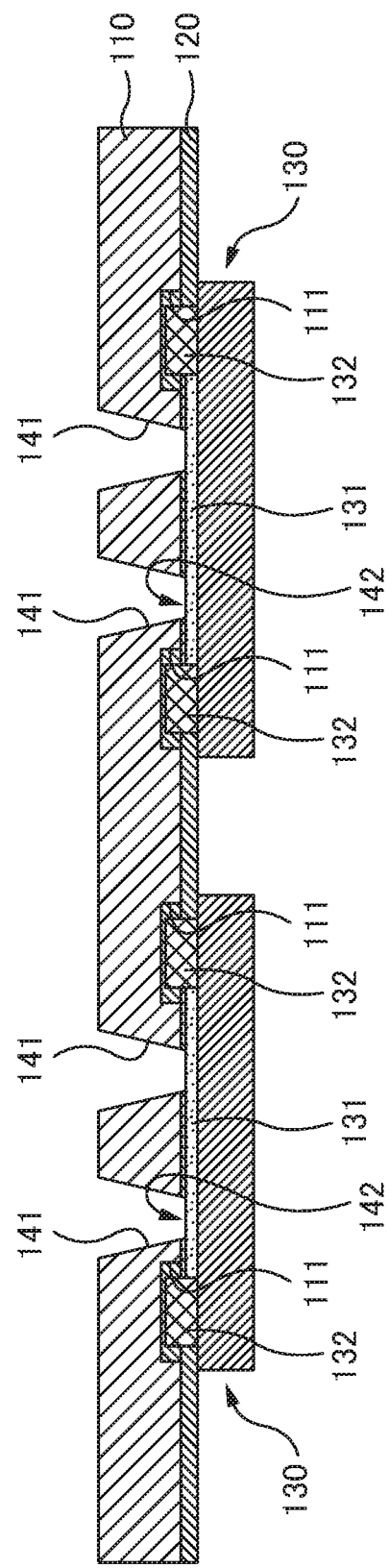
FIG. 9G is a cross-sectional view schematically illustrating a step of manufacturing a semiconductor module according to an embodiment of the present disclosure.

Next, as illustrated in FIG. 9G, the semiconductor elements 130 are bonded face down through the adhesion layer 120 such that the guard rings 132 enter the escape portions 111. Since such an escape portion 111 is formed, the adhesion layer 120 to be pushed out by such a guard ring 132 entering the escape portion 111 is pushed out in a direction away from the via hole 141 with the guard ring 132 serving as the center. Accordingly, it is possible to suppress the adhesion layer 120 from entering the via hole 141. Moreover, since the volume of the escape portion 111 is designed to be greater than the volume of the protrusion of the protrusion-shaped guard ring 132, it can be said that a surplus portion (surplus volume) of the escape portion 111 absorbs the escaping adhesion layer 120.

Figure 9H:
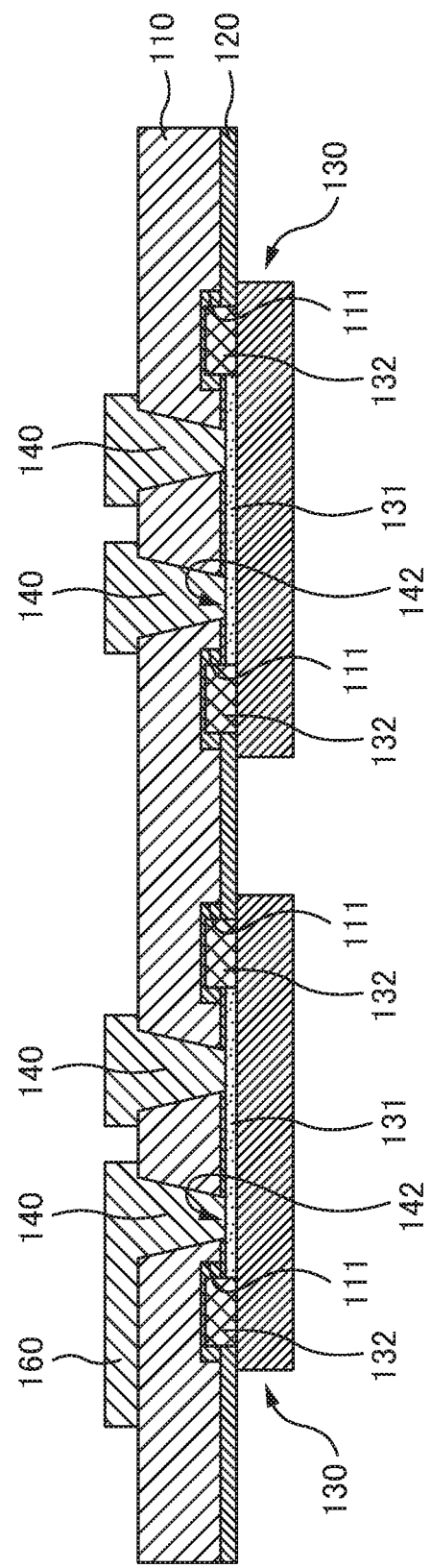
FIG. 9H is a cross-sectional view schematically illustrating a step of manufacturing a semiconductor module according to an embodiment of the present disclosure.

Then, as illustrated in FIG. 9H, the vias 140 are formed by introducing (plating) the conductive material into the via holes 141 by plating and the module electrodes 160 are simultaneously formed. In FIG. 9H, the vias 140 and the module electrodes 160 are integrally formed by plating the entire surface of the resin substrate 110, and then subjected to etching such that a desired pattern is formed. However, the patterning can be omitted such that openings are provided only in portions to be plated by using plating resist or the like, and then only these portions are plated. Either the entire surface plating and then patterning or such partial plating can be performed. As a result, the via 140 is formed to be integrally coupled to the module electrode 160 provided to the other surface of the resin substrate 110. Specifically, in the plan view, the via 140 is present, rewiring having one end on the via 140 is provided, and the module electrode 160 serving as an external electrode is formed on the other end of the rewiring.

Note that the aforementioned manufacturing steps are via-formation preceding steps in which the via holes 141 are formed before the semiconductor elements 130 are bonded. However, it is possible to employ via-formation following step in which the via holes 141 are formed after the semiconductor elements 130 are bonded. In this case, the semiconductor elements 130 are bonded with the adhesion layer 120 being in a semi-solid state.

Moreover, the present disclosure is not limited to the method of providing the escape portions 111 in the resin member. As illustrated in FIG. 8, the present disclosure may employ manufacturing steps of forming the resin substrate 110 in which a step is formed such that the surface of the resin substrate 110 facing the front surface of the element electrode 131 is closer to the front surface of the semiconductor element 130 than the surface of the resin substrate 110 facing the guard ring 132 is.

As described above, in an embodiment of the present disclosure, when the semiconductor element 130 is bonded to the resin substrate 110 via the adhesion layer 120, it is possible to significantly suppress the guard ring 132 (protruding portion) of the semiconductor element 130 from causing the adhesion layer 120 to flow into the via hole 141. Accordingly, it is possible to secure the desired contact area and suppress an increase in contact resistance. Since the power Tr is employed, temperature rise caused by high current naturally occurs also in this contact portion. However, since the desired contact area can be secured, it is possible to suppress the temperature rise.

Although an embodiment of the present disclosure of the present disclosure has been described above, the present disclosure is not limited to this. The materials, shapes, and arrangements of the members described above are merely embodiments for carrying out the present disclosure and various modifications can be made as long as they do not depart from the spirit of the present disclosure.

What is claimed is:

1. A semiconductor module comprising:
a flexible resin substrate made of a polyimide resin;
an adhesion layer provided on the resin substrate;
a semiconductor element mounted face down to the resin substrate and fixed to the resin substrate through the adhesion layer;
a via hole provided in the resin substrate to correspond to an element electrode of the semiconductor element;
a module electrode provided to the resin substrate to be in contact with the element electrode of the semiconductor element through the via hole;
a protruding portion provided, around the element electrode or in a peripheral edge portion of the semiconductor element, on a surface of the semiconductor element; and
an escape portion for the adhesion layer covering a head portion of the protruding portion to escape, the escape portion being provided in a region of the resin substrate corresponding to the protruding portion.

2. The semiconductor module according to claim 1, wherein
the protruding portion is formed on the surface of the semiconductor element such that the element electrode, a guard ring, or a field oxide film protrudes.

3. The semiconductor module according to claim 2, wherein
the protruding portion is formed, in a ring shape, around the element electrode, and
the escape portion has such a recess form as to receive a portion of the adhesion layer caused to flow by the protruding portion.

4. A semiconductor module comprising:
a flexible resin substrate made of a polyimide resin;

an adhesion layer provided on the resin substrate;

a semiconductor element mounted face down to the resin substrate and fixed to the resin substrate through the adhesion layer;

a via hole provided in the resin substrate to correspond to an element electrode of the semiconductor element;

a module electrode provided to the resin substrate to be in contact with the element electrode of the semiconductor element through the via hole; and a protruding portion provided, around the element electrode or in a peripheral edge portion of the semiconductor element, on a surface of the semiconductor element, the semiconductor module being formed such that an interval between a front surface of the protruding portion and a surface of the resin substrate facing the front surface of the protruding portion is greater than an interval between a front surface of the element electrode and a surface of the resin substrate facing the front surface of the element electrode.

5. The semiconductor module according to claim 4, wherein the protruding portion is formed on the surface of the semiconductor element such that the element electrode, a guard ring, or a field oxide film protrudes.

6. The semiconductor module according to claim 4, wherein the semiconductor element includes a current inflow electrode or current outflow electrode provided in a center portion and a control electrode to be used to control a current of the current inflow electrode or current outflow electrode, the protruding portion is provided between the current inflow electrode or current outflow electrode and the control electrode, and the resin substrate includes a recessed portion that is to be entered by the protruding portion.

7. The semiconductor module according to claim 4, wherein the protruding portion is provided between the current inflow electrode or current outflow electrode and a periphery of the semiconductor element.

8. A method of manufacturing a semiconductor module, comprising:

preparing a resin substrate having a surface provided with an adhesion layer, the resin substrate being provided with a via hole corresponding to an element electrode of a semiconductor element that is to be mounted, the resin substrate including an escape portion configured to prevent flow of the adhesion layer caused by a protruding portion, the protruding portion being provided, around the element electrode or in a peripheral edge portion of the semiconductor element, on the surface of the semiconductor element;

providing the semiconductor element while pressing the semiconductor element against the resin substrate such that the element electrode of the semiconductor element corresponds to the via hole; and providing an electrode to the via hole of the resin substrate, to be contact with the element electrode of the semiconductor element.

9. The method of manufacturing a semiconductor module according to claim 8, wherein the resin substrate is made of a polyimide resin.

10. The method of manufacturing a semiconductor module according to claim 9, wherein a difference in height between a head portion of the protruding portion and a head portion of the element electrode is 5 μm or more.

* * * * *